United States Patent
Im et al.

(10) Patent No.: US 8,956,933 B2
(45) Date of Patent: Feb. 17, 2015

(54) METHOD OF FORMING AN ACTIVE PATTERN, DISPLAY SUBSTRATE FORMED BY THE SAME, AND METHOD OF MANUFACTURING THE DISPLAY SUBSTRATE

(71) Applicant: Samsung Display Co., Ltd., Yongin, Gyeonggi-Do (KR)

(72) Inventors: Wan-Soon Im, Cheonan-si (KR); Young-Goo Song, Asan-si (KR); Hwa-Dong Jung, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/656,976

(22) Filed: Oct. 22, 2012

(65) Prior Publication Data
US 2013/0320345 A1    Dec. 5, 2013

(30) Foreign Application Priority Data
May 30, 2012    (KR) ........................ 10-2012-0057373

(51) Int. Cl.
*H01L 21/00*    (2006.01)
(52) U.S. Cl.
USPC ......................................................... 438/158
(58) Field of Classification Search
CPC ............ H01L 27/3241; H01L 27/3262; H01L 27/3244; H01L 29/4908; H01L 51/0508
USPC ................... 438/147–166; 257/40, E51.005
See application file for complete search history.

(56) References Cited

U.S. PATENT DOCUMENTS

| 7,807,496 B2 | 10/2010 | Fujimori et al. | |
|---|---|---|---|
| 2007/0040954 A1* | 2/2007 | Lee et al. | 349/43 |
| 2007/0087490 A1* | 4/2007 | Seo et al. | 438/158 |
| 2008/0230770 A1* | 9/2008 | Yoon et al. | 257/40 |

FOREIGN PATENT DOCUMENTS

| JP | 2010010310 A | 1/2010 |
|---|---|---|
| KR | 1020080002575 A | 1/2008 |

* cited by examiner

*Primary Examiner* — Brook Kebede
(74) *Attorney, Agent, or Firm* — Cantor Colburn LLP

(57) ABSTRACT

In a method of forming an active pattern, a gate metal layer is formed on a base substrate. The gate metal layer is patterned to form a gate line, and a gate pattern spaced apart from the gate line. A gate insulation layer is formed on the base substrate including the gate line and the gate pattern thereon, to form a first protruded boundary surface corresponding to an area including the gate pattern. An amorphous semiconductor layer is formed on the base substrate including the gate insulation layer thereon, to form a second protruded boundary surface corresponding to the first protruded boundary surface. The amorphous semiconductor layer is crystallized by illuminating a laser to the amorphous semiconductor layer on the second protruded boundary surface.

20 Claims, 10 Drawing Sheets

METHOD OF FORMING AN ACTIVE PATTERN, DISPLAY SUBSTRATE FORMED BY THE SAME, AND METHOD OF MANUFACTURING THE DISPLAY SUBSTRATE

This application claims priority to Korean Patent Application No. 10-2012-0057373, filed on May 30, 2012, and all the benefits accruing therefrom under 35 U.S.C. §119, the contents of which in its entirety is herein incorporated by reference.

BACKGROUND

1. Field

Exemplary embodiments of the invention relate to a method of forming an active pattern, a display substrate formed by the same, and a method of manufacturing the display substrate. More particularly, exemplary embodiments of the invention relate to a method of forming an active pattern, a display substrate formed by the same, and a method of manufacturing the display substrate which can simplify the manufacturing process.

2. Description of the Related Art

Generally, a thin film transistor ("TFT") to drive a pixel electrode in a display device includes a gate electrode, a source electrode, a drain electrode, and an active pattern forming a channel between the source electrode and the drain electrode. The active pattern includes a channel layer including amorphous silicon, polysilicon or an oxide semiconductor.

As the display device becomes highly integrated, an element forming area, in particular, an area corresponding to an active pattern has reduced, and a length of the channel layer has shortened. Accordingly, a technique to form an active pattern including a nano-wire has developed. For example, a method of forming the active pattern including the nano-wire includes a method of forming the active pattern using lithography and etching processes, and a method of directly developing the active pattern on a substrate using a catalyst.

The method of forming the active pattern using the lithography and etching processes has advantages in forming the active pattern by a process compatible with a conventional semiconductor process and in forming the channel relatively uniformly in a desired area. However, the method of forming the active pattern using the lithography and etching processes has disadvantages of complicated processes and expensive facilities required to perform the method.

On the other hand, the method of directly developing the active pattern on the substrate using the catalyst has an advantage of inexpensiveness in forming the active pattern while the method has a disadvantage of difficulties in forming a high quality active pattern in a desired area.

SUMMARY

One or more exemplary embodiments of the invention provide a method of forming an active pattern including a nano-wire.

One or more exemplary embodiments of the invention also provide a display substrate formed by the method of forming the active pattern.

One or more exemplary embodiments of the invention still also provide a method of manufacturing the display substrate.

In an exemplary embodiment of a method of forming an active pattern according to the invention, the method includes forming a gate metal layer on a base substrate, patterning the gate metal layer to form a gate line and a gate pattern spaced apart from the gate line, forming a gate insulation layer on the base substrate including the gate line and the gate pattern, to form a first protruded boundary surface corresponding to an area including the gate pattern, forming an amorphous semiconductor layer on the base substrate including the gate insulation layer, to form a second protruded boundary surface corresponding to the first protruded boundary surface, and illuminating a laser on the amorphous semiconductor layer on the second protruded boundary surface to crystallize the amorphous semiconductor layer.

In the exemplary embodiment, the amorphous semiconductor layer may include amorphous silicon.

In the exemplary embodiment, the intensity of the laser may be substantially equal to or greater than about 500 millijoules per square centimeter ($mJ/cm^2$) and may be substantially equal to or lower than about 550 $mJ/cm^2$.

In the exemplary embodiment, the gate pattern may have a substantially rectangular shape having a longer side and a shorter side.

In the exemplary embodiment, the gate pattern may have a substantially 'H' or 'I' shape. Opposite ends of the gate pattern may have a first width. An area between the opposite ends may have a second width smaller than the first width.

In an exemplary embodiment of a display substrate according to the invention, the display substrate includes a base substrate, a gate line extending to a first direction on the base substrate, a gate electrode spaced apart from the gate line, a gate insulation layer on the gate line and the gate electrode, an active pattern on the gate insulation layer and overlapping the gate electrode, and a gate connection layer electrically connecting the gate line and the gate electrode through a first contact hole. The active pattern includes polysilicon. The first contact hole partially exposes the gate line, the gate electrode, and the base substrate corresponding to an area between the gate line and the gate electrode.

In the exemplary embodiment, the gate electrode may have a substantially rectangular shape having a longer side and a shorter side. A longitudinal direction of a channel of the active pattern may be substantially parallel with the longer side.

In the exemplary embodiment, the gate electrode may have a substantially 'H' or 'I' shape including a first gate electrode part at opposite ends of the gate electrode and having a first width, and a second gate electrode part between the opposite ends of the gate electrode and having a second width smaller than the first width.

In the exemplary embodiment, a longitudinal direction of a channel of the active pattern may be substantially parallel with the first direction. A source electrode electrically connected to a data line, and a drain electrode electrically connected to a pixel electrode, may overlap opposite ends of the active pattern corresponding to the first gate electrode part.

In the exemplary embodiment, the first contact hole may partially expose the first gate electrode part of the gate electrode. The gate connection layer may electrically connect the first gate electrode part and the gate line.

In the exemplary embodiment, a channel of the active pattern may be substantially parallel with a second direction which is substantially perpendicular to the first direction. A source electrode electrically connected to a data line, and a drain electrode electrically connected to a pixel electrode, may overlap opposite ends of the active pattern corresponding to the first gate electrode part.

In an exemplary embodiment of a method of manufacturing a displaying substrate according to the invention, the method includes forming a gate metal layer on a base substrate, patterning the gate metal layer using a first mask, to form a gate line extending in a first direction and a gate electrode spaced apart from the gate line, forming a gate insulation layer on the base substrate including the gate line and the gate electrode, to form a first protruded boundary surface corresponding to an area including the gate electrode, forming an amorphous silicon layer on the base substrate including the gate insulation layer, to form a second protruded boundary surface corresponding to the first protruded boundary surface, crystallizing the amorphous silicon layer by illuminating a laser on the amorphous silicon layer on the second protruded boundary surface, to form an active pattern, forming a first contact hole partially exposing the gate line, the gate electrode, and the base substrate corresponding to an area between the gate line and the gate electrode, and forming a gate connection layer electrically connecting the gate line and the gate electrode through the first contact hole.

In the exemplary embodiment, the intensity of the laser may be substantially equal to or greater than about 500 mJ/cm$^2$ and is substantially equal to or lower than about 550 mJ/cm$^2$.

In the exemplary embodiment, the gate electrode may have a substantially rectangular shape having a longer side and a shorter side.

In the exemplary embodiment, the gate electrode may have a substantially 'H' or 'I' shape including a first gate electrode part at opposite ends of the gate electrode and having a first width, and a second gate electrode part between the opposite ends of the gate electrode and having a second width smaller than the first width.

In the exemplary embodiment, the method may further include forming a source electrode electrically connected to a data line, and a drain electrode spaced apart from the source electrode, and forming a passivation layer on the base substrate including the data line, the source electrode, and the drain electrode. The source electrode may overlap one end of the active pattern. The drain electrode may overlap another end of the active pattern. The passivation layer may include silicon oxide.

In the exemplary embodiment, the forming the source electrode and the drain electrode may include forming a photoresist pattern using a second mask, forming a data line and an electrode pattern connected to the data line, using the photoresist pattern as an etch stopping layer, ashing the photoresist pattern to form a remaining photoresist pattern in which a second thickness part is removed, and patterning the electrode pattern using the remaining photoresist pattern to expose the active pattern between the source electrode and the drain electrode. The photoresist pattern may have a first thickness part and the second thickness part thinner than the first thickness part.

In the exemplary embodiment, the method may further include forming a second contact hole exposing a drain electrode overlapping one end of the active pattern, and forming a pixel electrode electrically connected to the drain electrode through the second contact hole.

In the exemplary embodiment, the first contact hole and the second contact hole may be formed in a same process using a third mask.

In the exemplary embodiment, the forming the gate connection layer and the forming the pixel electrode may include forming a transparent conductive layer on the base substrate including the first contact hole and the second contact hole, and patterning the transparent conductive layer using a fourth mask, to form the gate connection layer and the pixel electrode simultaneously.

According to one or more exemplary embodiment of the method of forming the active pattern, the display substrate formed by the same, and the method of manufacturing the display substrate, an active pattern can be formed using a gate pattern and a laser crystallization process. Accordingly, the manufacturing processes can be simplified, and the active pattern can be formed in a desired area at a low cost with high quality.

Also, a width and a length of the channel can be adjusted by changing the size of a gate pattern.

Also, the manufacturing cost can be reduced by using a four masks process in a method of manufacturing the display substrate.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1A:
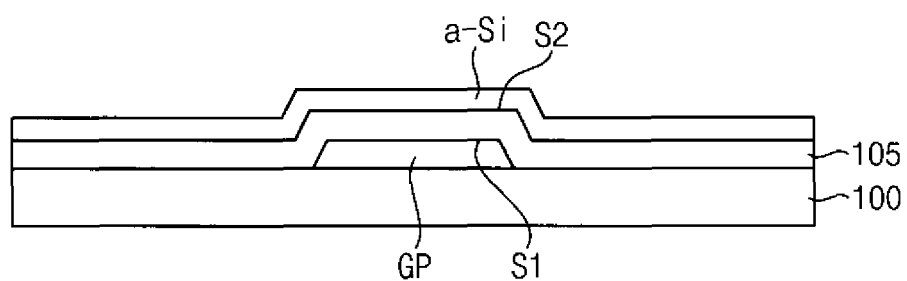
FIGS. 1A and 1B are cross-sectional views illustrating an exemplary embodiment of a method of forming an active pattern according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" or "lower" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 1B:
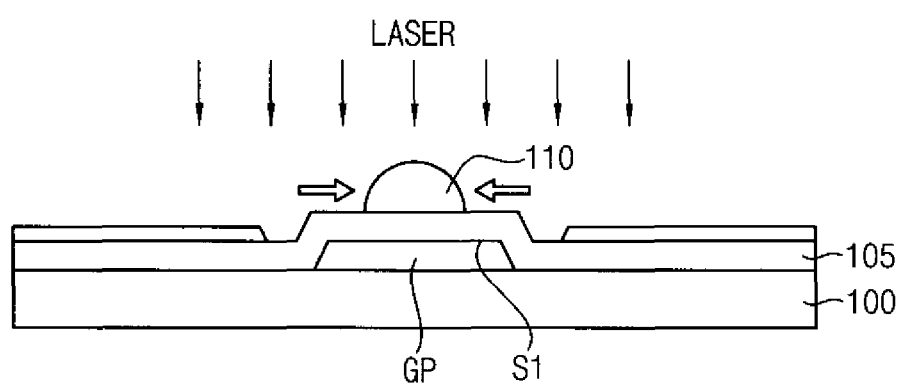
Figure 2:
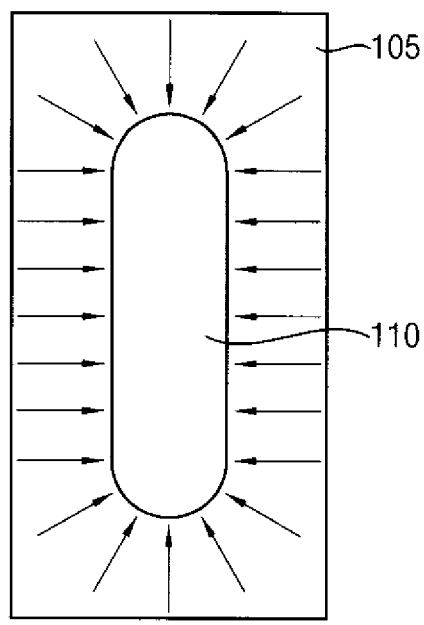
FIG. 2 is a plan view illustrating the method of forming the active pattern of FIGS. 1A and 1B.

FIGS. 1A and 1B are cross-sectional views illustrating an exemplary embodiment of a method of forming an active pattern according to the invention. FIG. 2 is a plan view illustrating the method of forming the active pattern of FIGS. 1A and 1B.

Referring to FIG. 1A, in an exemplary embodiment of the invention, a gate metal layer is formed on a base substrate 100. A gate pattern GP is formed such as by patterning the gate metal layer. The gate pattern GP may be formed using a photolithography method or a mask, but is not limited thereto or thereby.

A gate insulation layer 105 is formed on the gate pattern GP. The gate insulation layer 105 is formed to have a protruded upper surface corresponding to the gate pattern GP. Accordingly, a first boundary surface 51 is formed on an area including the gate pattern GP.

An amorphous silicon layer a-Si is formed on the base substrate 100 including the gate pattern GP and the gate insulation layer 105. In one exemplary embodiment, for example, the amorphous silicon layer a-Si may be about 144.2 nanometers (nm) in thickness, taken in a direction perpendicular to the base substrate 100. The amorphous silicon layer a-Si has an upper surface protruded corresponding to the gate pattern GP. That is, a second boundary surface S2 is formed in an area corresponding to the first boundary surface S1. Boundary surfaces of an active pattern may be defined by the sequentially formed gate insulation layer 105 and the amorphous silicon layer a-Si.

Referring to FIGS. 1B and 2, an active pattern is formed by illuminating a laser on the base substrate 100 including the amorphous silicon layer a-Si. The amorphous silicon layer a-Si is melted by the laser. The melted amorphous silicon layer a-Si flows from a low surface tension area to a high surface tension area by the Marangoni effect. Specifically, when a laser having a light intensity of about 500 millijoules per square centimeter ($mJ/cm^2$) is illuminated on the amorphous silicon layer a-Si, the amorphous silicon layer a-Si melts and changes to a liquid state, and the amorphous silicon layer a-Si formed on a protruded upper surface corresponding to the gate pattern GP has a droplet shape when viewed cross-sectionally. In one exemplary embodiment, for example, the amorphous silicon layer a-Si on the protruded upper surface corresponding to the gate pattern GP may be about 295.9 nm in thickness when the silicon melts and flows by the Marangoni effect.

When the laser keeps illuminating on the amorphous silicon layer a-Si, the temperature of a center of the amorphous silicon layer a-Si increases more than the temperature of a periphery of the amorphous silicon layer a-Si. Accordingly, a surface tension in the center increases more than a surface tension in the periphery, the peripheral amorphous silicon layer a-Si flows to the center of the protruded upper surface corresponding to the gate pattern GP and the amorphous silicon layer a-Si becomes crystallized. That is, an active pattern 110 including a polysilicon is formed to have a droplet shape when viewed cross-sectionally. In one exemplary embodiment, for example, the thickness of the droplet-shaped polysilicon may be about 902.4 nm.

The active pattern 110 including the polysilicon is formed on a center of the protruded upper surface of the gate insulation layer 105 corresponding to the gate pattern GP. The active pattern 110 may have a desired thickness according to a light intensity of the laser.

According to an exemplary embodiment of the invention, the active pattern 110 may be formed using the gate pattern GP and the laser crystallization process. Also, a width and a length of the active pattern 110 in a plan view may be adjusted by a planar shape of the gate pattern GP. Accordingly, manufacturing processes used to form an active pattern for a thin film transistor of a display device can be simplified, and the active pattern can be formed in a desired area at a low cost with high quality.

Hereinafter, a display substrate manufactured using the method of forming the active pattern will be described in further detail.

Figure 3:
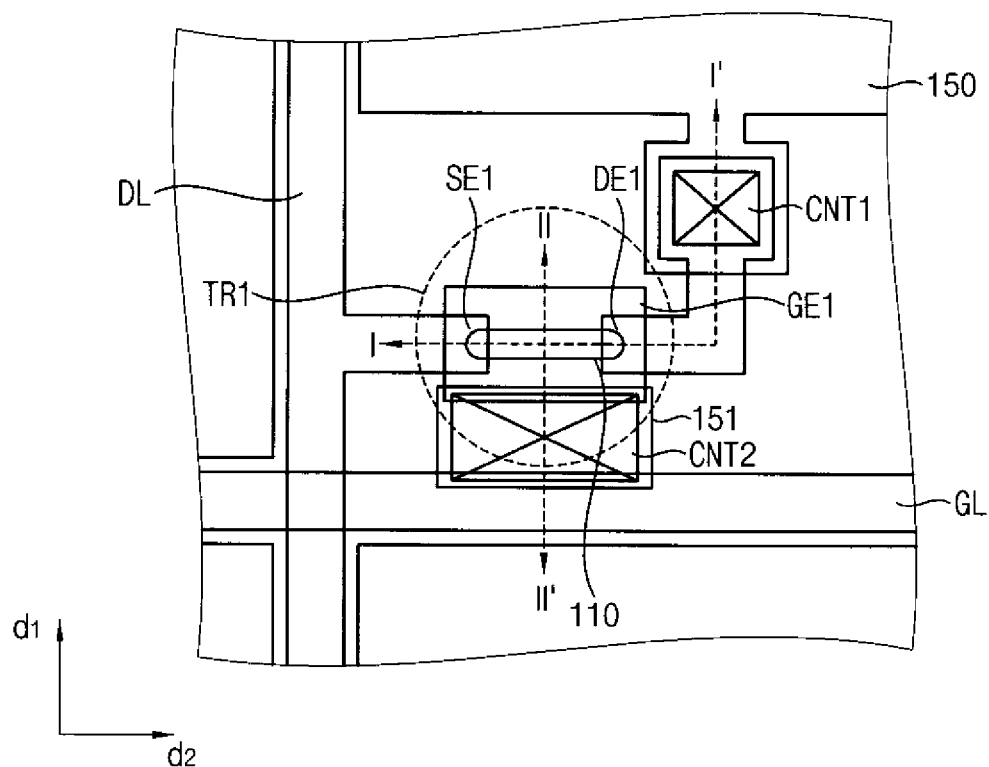
FIG. 3 is a plan view illustrating an exemplary embodiment of a display substrate according to the invention.

FIG. 3 is a plan view illustrating an exemplary embodiment of a display substrate according to the invention.

Referring to FIG. 3, an exemplary embodiment of a display substrate according to the invention includes a gate line GL, a data line DL, a thin film transistor TR1, a pixel electrode 150, and a gate connection layer 151, on a base substrate 100, respectively.

The data line DL has a longitudinal axis which extends in a first direction d1. The display substrate may include a plurality of data lines DL. The gate line GL has a longitudinal axis which extends in a second direction d2 crossing the first direction d1. The display substrate may include a plurality of gate lines GL.

The thin film transistor TR1 is electrically connected to the gate line GL and the data line DL. In one exemplary embodiment, the thin film transistor TR1 may be disposed in an area where the gate line GL and the data line DL are crossed, but is not limited thereto or thereby.

The thin film transistor TR1 includes a gate electrode GE1, a source electrode SE1 and a drain electrode DE1. The gate electrode GE1 is electrically connected to the gate line GL. Specifically, the gate electrode GE1 is spaced apart from the gate line GL in the first direction d1, and is electrically connected to the gate line GL via the gate connection layer 151.

The source electrode SE1 may be integral with the data line DL, such as forming a single, unitary, indivisible member, but is not limited thereto or thereby. The source electrode SE1 may have a protruded shape extended from the data line DL, such as in the second direction d2.

The thin film transistor TR1 will be described in further detail referring to FIGS. 4 and 5.

The pixel electrode 150 is electrically connected to the thin film transistor TR1. When the thin film transistor TR1 is turned on, a data voltage is applied to the pixel electrode 150 from the data line DL.

The gate connection layer 151 electrically connects the gate line GL and the gate electrode GE1.

Figure 4:
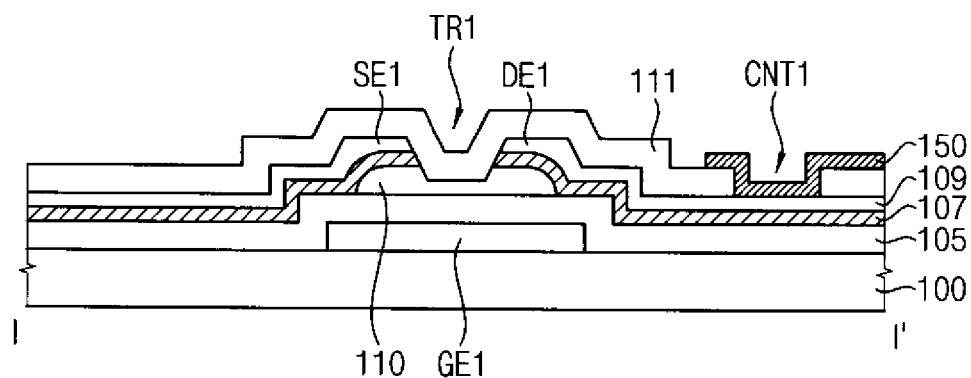
FIG. 4 is a cross-sectional view taken along line I-I' of FIG. 3.

FIG. 4 is a cross-sectional view taken along line I-I' of FIG. 3. FIG. 5 is cross-sectional view taken along line II-II' of FIG. 3.

Figure 5:
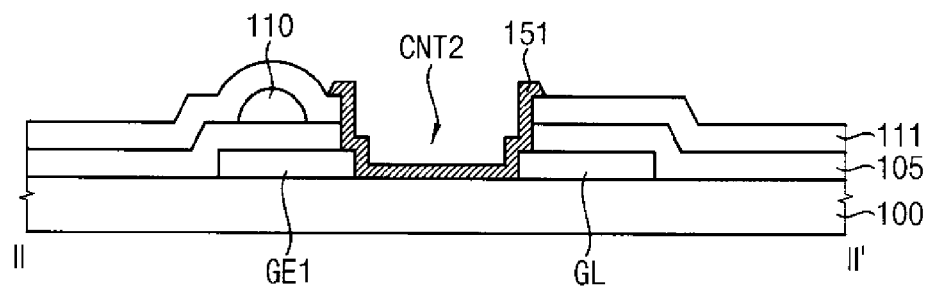
FIG. 5 is cross-sectional view taken along line II-II' of FIG. 3.
Figure 6A:
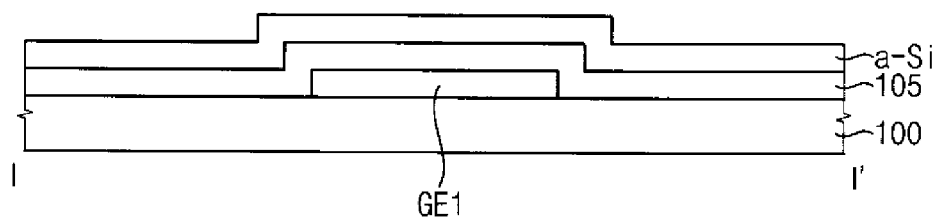
FIGS. 6A to 6G are cross-sectional views taken along line I-I' of FIG. 3 illustrating an exemplary embodiment of a method of manufacturing the display substrate of FIG. 3.
Figure 6B:
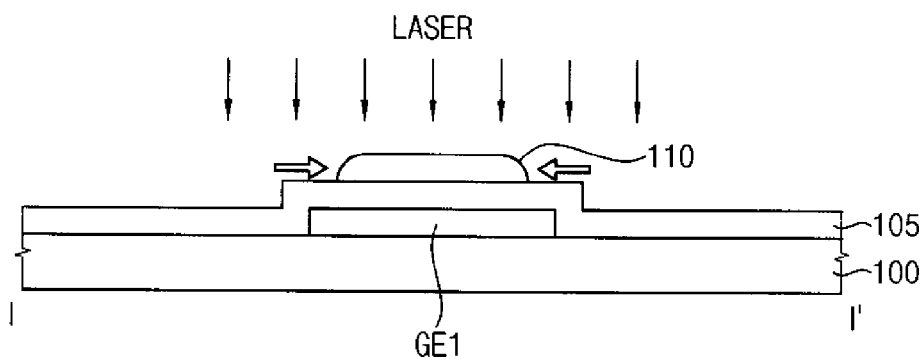
Figure 6C:
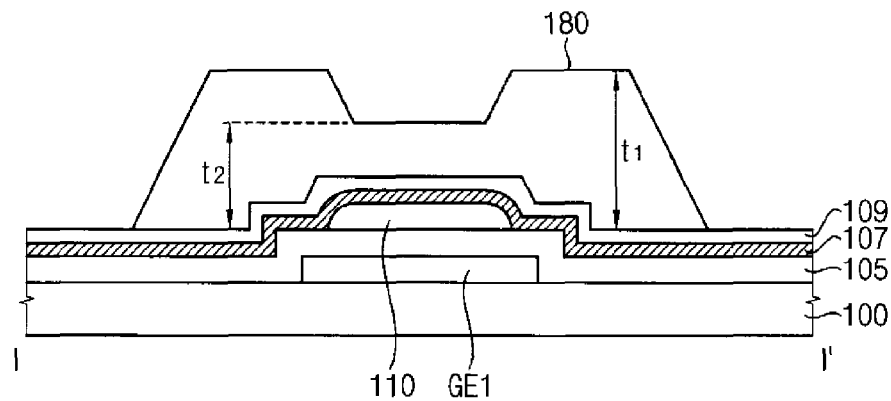
Figure 6D:
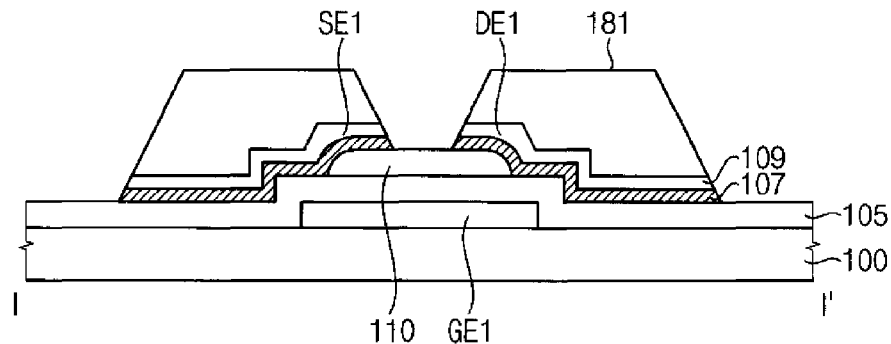
Figure 6E:
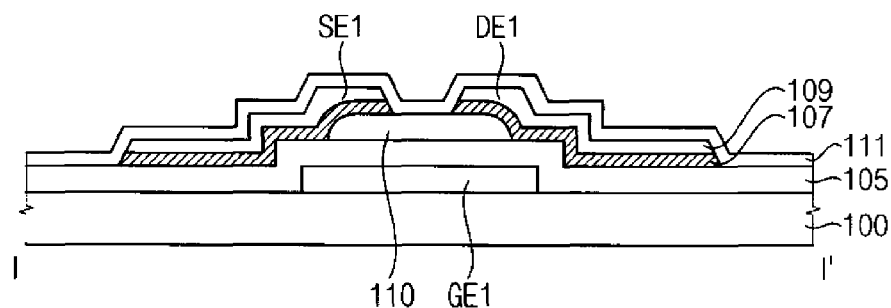
Figure 6F:
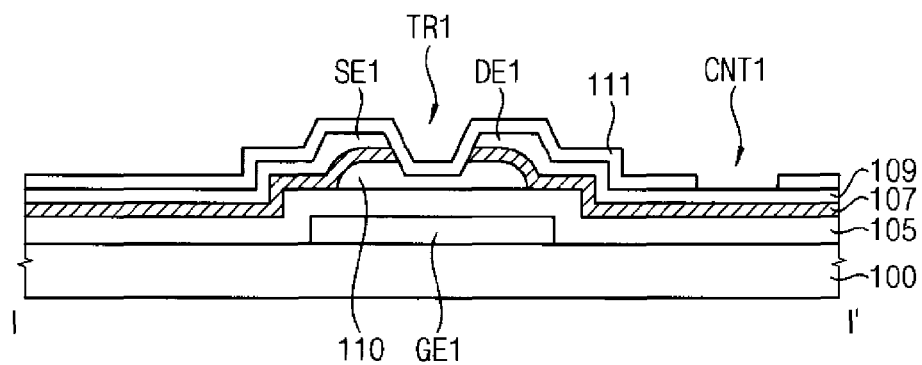
Figure 6G:
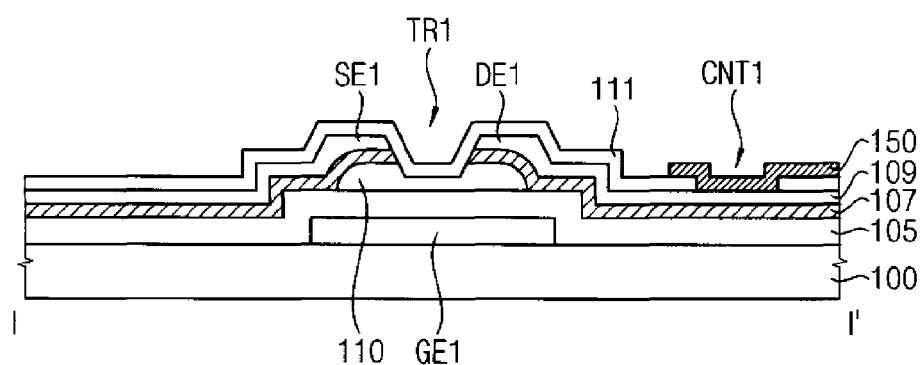

Referring to FIGS. 3 to 5, the display substrate includes the base substrate 100, the gate electrode GE1, a gate insulation layer 105, the active pattern 110, an ohmic contact layer 107, the source electrode SE1, the drain electrode DE1, a passivation layer 111, a first contact hole CNT1, a second contact hole CNT2, the pixel electrode 150 and the gate connection layer 151.

The gate electrode GE1 is on the base substrate 100 and spaced apart from the gate line GL in the first direction d1. In one exemplary embodiment, for example, the gate electrode GE1 may have a substantially rectangular shape in a planview of the display substrate. Specifically, in one exemplary embodiment of forming the display substrate, the gate electrode GE1 may be a gate pattern GP which is formed by patterning a gate metal layer, but is not limited thereto or thereby.

The gate electrode GE1 may have a substantially rectangular planar shape having a first side extending in the first direction d1, and a second side longer than the first side and extending in the second direction d2, such as perpendicular to the first direction d1.

The gate electrode GE1 may include aluminum (Al), copper (Cu), molybdenum (Mo), titanium (Ti), alloys thereof or a combination thereof. Alternatively, the gate electrode GE1 may include a transparent conductive material such as indium tin oxide ("ITO"), indium zinc oxide ("IZO"), aluminum doped zinc oxide ("AZO") or a combination thereof.

The gate electrode GE1 may have a single layer structure, but is not limited thereto or thereby. Alternatively, the gate electrode GE1 may have a multiple layer structure in which a plurality of conductive layers is stacked, or conductive layers and insulation layers are stacked.

The gate insulation layer 105 is on the gate electrode GE1. The gate insulation layer 105 insulates the gate line GL and the data line DL from each other. Also, the gate insulation layer 105 insulates the gate electrode GE1 and the active pattern 110 from each other. The gate insulation layer 105 may be on a whole area of the base substrate 110, but is not limited thereto or thereby.

The gate insulation layer 105 may include a silicon oxide (SiOx) or a silicon nitride (SiNx). The gate insulation layer 105 may have a single layer structure, or a multiple layer structure. In one exemplary embodiment, for example, the gate insulation layer 105 may include a first layer on the gate electrode GE1, and a second layer on the first layer such that the first layer is between the gate electrode GE1 and the second layer. The first layer may include silicon nitride (SiNx), and the second layer may include silicon oxide (SiOx), but are not limited thereto or thereby.

The active pattern 110 is on the gate insulation layer 105 corresponding to an area including the gate electrode GE1. Specifically, the active pattern 110 overlaps a center of an area corresponding to the gate electrode GE1. The active pattern 110 functions as a channel layer of the thin film transistor TR1.

The active pattern 110 may include polysilicon, but is not limited thereto or thereby. Specifically, in one exemplary embodiment of forming the display substrate, the active pattern 110 including polysilicon may be formed by illuminating a laser on an amorphous silicon a-Si on the gate insulation layer 105, and then crystallizing the amorphous silicon a-Si. Accordingly, the active pattern 110 is formed to have a longitudinal axis which is extended in the second direction d2 corresponding to the rectangular shape of the gate electrode GE1. That is, similar to the gate electrode GE1, the active pattern 110 may have a first side extending in the first direction d1, and a second side longer than the first side and extending in the second direction d2, such as perpendicular to the first direction d1.

As an exemplary embodiment of a thin film transistor according to the invention includes an active pattern formed using a gate electrode and a laser crystallization process, a width of the active pattern which is used as a channel of the thin film transistor may be adjusted by changing a width of the gate electrode. Accordingly, the manufacturing processes can be simplified, and the active pattern can be formed in a desired area at a low cost with high quality.

In an exemplary embodiment, the ohmic contact layer 107 may be formed on the base substrate 100 including the active pattern 110 thereon. The ohmic contact layer 107 may include amorphous silicon doped with impurities, but is not limited thereto or thereby.

In an exemplary embodiment, the source electrode SE1 and the drain electrode DE1 may be formed on the base substrate 100 including the ohmic contact layer 107 thereon. The source electrode SE1 and the drain electrode DE1 overlap the active pattern 110. The drain electrode DE1 is spaced apart from the source electrode SE1. Specifically, the source electrode SE1 overlaps a first end of the active pattern 110 in the second direction d2. The drain electrode DE1 overlaps a second end of the active pattern 110 opposite to the first end, in the second direction d2.

The source electrode SE1 and the drain electrode DE1 may include aluminum (Al), copper (Cu), molybdenum (Mo), titanium (Ti), alloys thereof or a combination thereof. Alternatively, the source electrode SE1 and the drain electrode DE1 may include a transparent conductive material such as indium tin oxide ("ITO"), indium zinc oxide ("IZO"), aluminum doped zinc oxide ("AZO") or a combination thereof.

In an exemplary embodiment, the passivation layer 111 may be formed on the base substrate 100 including the source electrode SE1 and the drain electrode DE1 thereon. The passivation layer 111 may on a whole area of the base substrate 100, but is not limited thereto or thereby. The passivation layer 111 may include, for example, silicon oxide (SiOx) or silicon nitride (SiNx).

The passivation layer 111 may have a single layer structure or a multiple layer structure. In one exemplary embodiment, for example, the passivation layer 111 may include a first layer, and a second layer on the first layer. The first layer may include silicon oxide (SiOx), the second layer may include silicon nitride (SiNx), but are not limited thereto or thereby.

The passivation layer 111 includes the first contact hole CNT1 and the second contact hole CNT2 extended through a thickness thereof. The first contact hole CNT1 exposes the drain electrode DE1. The second contact hole CNT2 is in an area between the gate electrode GE1 and the gate line GL. The second contact hole CNT2 partially exposes the base substrate 100, the gate electrode GE1 and the gate line GL.

The pixel electrode 150 is electrically connected to the drain electrode DE1 through the first contact hole CNT1. The pixel electrode 150 may include a transparent conductive material such as indium tin oxide ("ITO"), indium zinc oxide ("IZO, aluminum doped zinc oxide ("AZO") or a combination thereof. When the thin film transistor TR1 is turned on, a data voltage is applied from the data line DL to the pixel electrode 150.

The gate connection layer 151 electrically connects the gate electrode GE1 and the gate line GL through the second contact hole CNT2. The gate connection layer 151 may include a transparent conductive material such as indium tin oxide ("ITO"), indium zinc oxide ("IZO"), aluminum doped zinc oxide ("AZO") or a combination thereof.

FIGS. 6A to 6G are cross-sectional views taken along line I-I' of FIG. 3 illustrating an exemplary embodiment of a method of manufacturing the display substrate of FIG. 3. FIGS. 7A to 7F are cross-sectional views taken along line II-II' of FIG. 3 illustrating the exemplary embodiment of the method of manufacturing the display substrate of FIG. 3.

Hereinafter, an exemplary embodiment of a method of manufacturing a display substrate will be described in further detail referring to FIGS. 6A to 7F.

Referring to FIGS. 3 to 5, 6A, 7A, and 7B, a gate metal layer 101 is formed on a base substrate 100. A gate electrode GE1 and a gate line GL are formed by patterning the gate metal layer 101. The gate electrode GE1 may be formed patterning the gate metal layer 101 using a first mask, but is not limited thereto or thereby. The gate electrode GE1 is spaced apart from the gate line GL in a first direction d1, on the base substrate 100. The gate electrode GE1 may have, for example, a substantially rectangular shape in a plan view. Specifically, the gate electrode GE1 may have a substantially rectangular shape having a first side extending in the first direction d1, and a second side longer than the first side and extending in a second direction d2, such as perpendicular to the first direction d1.

A gate insulation layer 105 is formed on the gate electrode GE1 and the gate line GL. The gate insulation layer 105 has a protruded upper surface corresponding to the gate electrode GE1 which protrudes from an upper surface of the base substrate 100. The gate insulation layer 105 may have a protruded upper surface corresponding to the gate line GL. Alternatively, the gate insulation layer 105 may have a flattened surface corresponding to the gate line GL, such that an upper surface of the gate insulation layer 105 overlapping the gate line GL is substantially coplanar with other portions of the upper surface of the gate insulation layer 105.

An amorphous silicon layer a-Si is formed on the base substrate 100 including the gate insulation layer 105 thereon. Although the amorphous silicon layer a-Si is not formed on an area corresponding to the gate line GL in FIG. 6B, the amorphous silicon layer a-Si may be formed on a whole area of the gate insulation layer 105.

Referring to FIGS. 3 to 5, 6B, and 7C, an active pattern 110 is formed by illuminating a laser on the amorphous silicon layer a-Si which is on the base substrate 100. The amorphous silicon layer a-Si is melted by the laser. The melted amorphous silicon layer a-Si flows from a low surface tension area to a high surface tension area by the Marangoni effect, as indicated by the horizontal arrows in FIGS. 6B and 7C. Specifically, when a laser having a light intensity greater than 500 mJ/cm$^2$ is illuminated on the amorphous silicon layer a-Si, the amorphous silicon layer a-Si formed on a protruded upper surface corresponding to the gate electrode GE1 and has a droplet shape when viewed cross-sectionally.

When the laser keeps illuminating the amorphous silicon layer a-Si, the temperature of a center of the amorphous silicon a-Si increases higher than the temperature of a periphery of the amorphous silicon a-Si. Accordingly, a surface tension in the center becomes larger than a surface tension in the periphery, and the amorphous silicon a-Si in the periphery flows toward a center of the protruded upper surface corresponding to the gate electrode GE1, which crystallizes the amorphous silicon a-Si. That is, an active pattern 110 including polysilicon is formed to have a droplet shape. Accordingly, the active pattern 110 is formed to have a longitudinal axis which extends in the second direction d2 which corresponds to the gate electrode GE1 having a substantially rectangular shape with a longitudinal axis in the second direction d2. The active pattern 110 functions as a channel layer of a thin film transistor TR1.

Figure 7A:
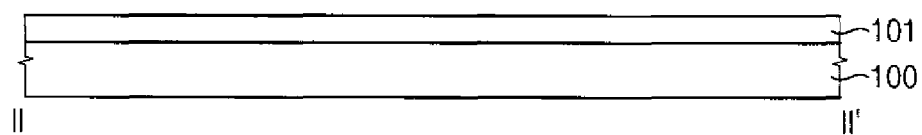
FIGS. 7A to 7F are cross-sectional views taken along line II-II' of FIG. 3 illustrating the exemplary embodiment of the method of manufacturing the display substrate of FIG. 3.
Figure 7B:
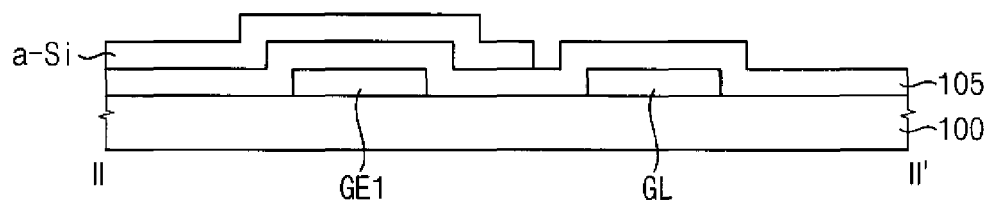
Figure 7C:
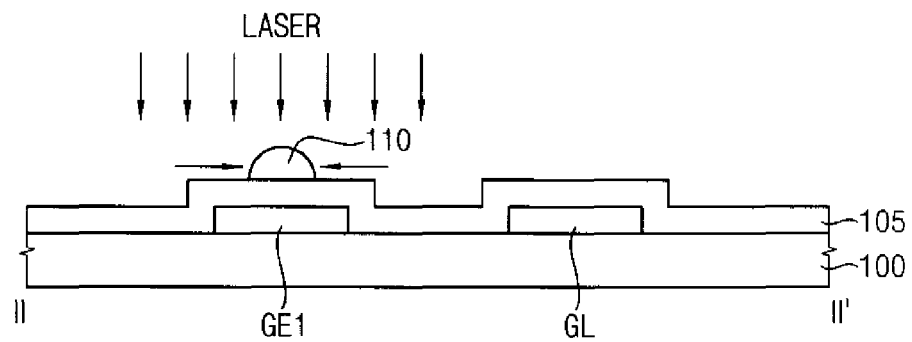
Figure 7D:
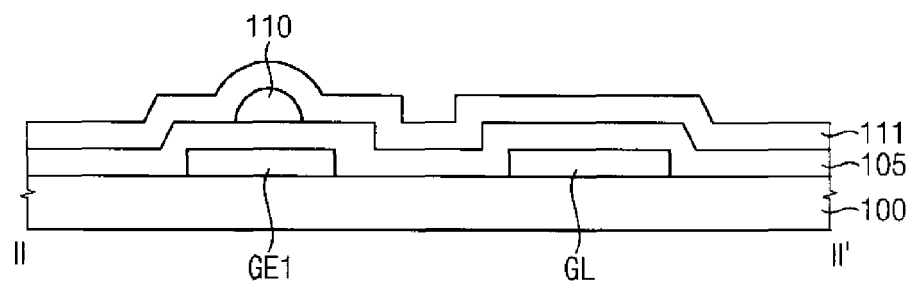
Figure 7E:
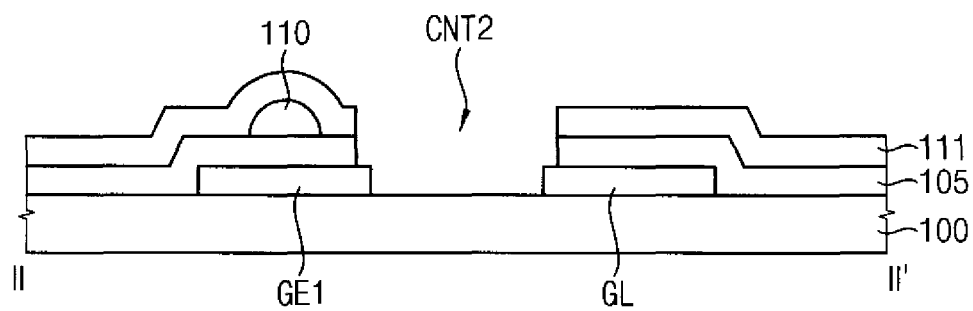
Figure 7F:
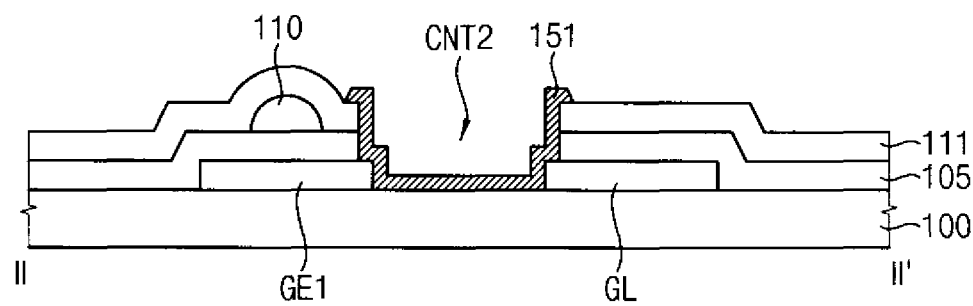

Although the laser is partially illuminated on the base substrate 100 in FIG. 7C, the laser may be illuminated on a whole area of the base substrate 100. Accordingly, a polysilicon pattern may be formed on an area other than the area corresponding to the gate electrode GE1.

Referring to FIGS. 3 to 5, and 6C, an ohmic contact layer 107 is formed on the base substrate 100 including the active pattern 110 thereon. The ohmic contact layer 107 may include amorphous silicon n+ a-Si doped with impurities, but is not limited thereto or thereby. The ohmic contact layer 107 may be formed on a whole area on the base substrate 100 including the active pattern 110 thereon.

A source-drain metal layer 109 is formed on the base substrate 100 including the ohmic contact layer 107. The source-drain metal layer 109 may include aluminum (Al), copper (Cu), molybdenum (Mo), titanium (Ti), alloys thereof or a combination thereof. Alternatively, the source-drain metal layer may include a transparent conductive material such as indium tin oxide ("ITO"), indium zinc oxide ("IZO"), aluminum doped zinc oxide ("AZO") or a combination thereof.

A photoresist pattern 180 is formed on the source-drain metal layer 109 using a second mask. The photoresist pattern 180 may be formed by coating a positive-type or negative-type photoresist composition, exposing the photoresist composition and developing the photoresist composition. The photoresist pattern 180 includes a first thickness part having a first thickness t1, and a second thickness part having a second thickness t2 smaller than the first thickness t1. The first thickness part is formed on an area in which the source-drain metal layer 109 remains. The photoresist pattern 180 is not formed on an area in which the source-drain metal layer 109 is removed. The second thickness part is formed on an area including the active pattern 110 of the thin film transistor TR1.

Referring to FIGS. 3 to 5, and 6D, an electrode pattern remaining under the photoresist pattern 180, and a data line DL connected to the electrode pattern and crossing the gate line GL are formed by etching the source-drain metal layer 109 and the ohmic contact layer 107 using the photoresist pattern 180 as an etch stopping layer. Although not shown in FIG. 6D, the polysilicon pattern formed on an area other than the area corresponding to the gate electrode GE1 is also etched with the source-drain metal layer 109 and the ohmic contact layer 107.

The photoresist pattern 180 is etch-backed, such as by ashing, to form a remaining photoresist pattern 181 of which the second thickness part of the photoresist pattern 180 is removed. Specifically, the photoresist pattern 180 is removed in a desired thickness by the etch-back process. Accordingly, the second thickness part is removed to expose the source-drain metal layer 109 on an area including the active pattern 110 of the thin film transistor TR1.

Then, the source-drain metal layer 109 and the ohmic contact layer 107 formed on the active pattern 110 of the thin film transistor TR1 are sequentially etched to form a source electrode SE1 and a drain electrode DE1, and to partially expose the active pattern 110.

Referring to FIGS. 3 to 5, 6E, and 7D, a passivation layer 111 is formed on the base substrate 100 including the source electrode SE1 and the drain electrode DE1 thereon. The passivation layer 111 may be formed on a whole area of the base substrate 100, but is not limited thereto or thereby. The passivation layer 111 may include silicon oxide (SiOx) or silicon nitride (SiNx).

Referring to FIGS. 3 to 5, 6F, and 7E, a first contact hole CNT1 and a second contact hole CNT2 are formed in the passivation layer 111 using a third mask, and may be formed in a same process using the third mask. The second contact hole CNT2 may also extend through the gate insulating layer 105. The first contact hole CNT1 exposes the drain electrode DE1. The second contact hole CNT2 is formed in an area between the gate electrode GE1 and the gate line GL. The second contact hole CNT2 partially exposes the base substrate 100, the gate electrode GE1 and the gate line GL.

Referring to FIGS. 3 to 5, 6G, and 7F, a transparent conductive layer (not shown) is formed on the base substrate 100 including the passivation layer 270 thereon. The transparent conductive layer may include a transparent conductive material such as indium tin oxide ("ITO"), indium zinc oxide ("IZO"), aluminum doped zinc oxide ("AZO") or a combination thereof. A pixel electrode 150 and a gate connection layer 151 are formed by patterning the transparent conductive layer using a fourth mask. The pixel electrode 150 contacts the drain electrode DE1 through the first contact hole CNT1. The gate connection layer 151 electrically connects the gate electrode GE1 and the gate line GL to each other, through the second contact hole CNT2.

According to an exemplary embodiment of the method of forming the thin film transistor, an active pattern may be formed using a gate electrode and a laser crystallization process. Accordingly, the manufacturing processes using four masks can be simplified, and the active pattern can be formed in a desired area at a low cost with high quality.

Figure 8:
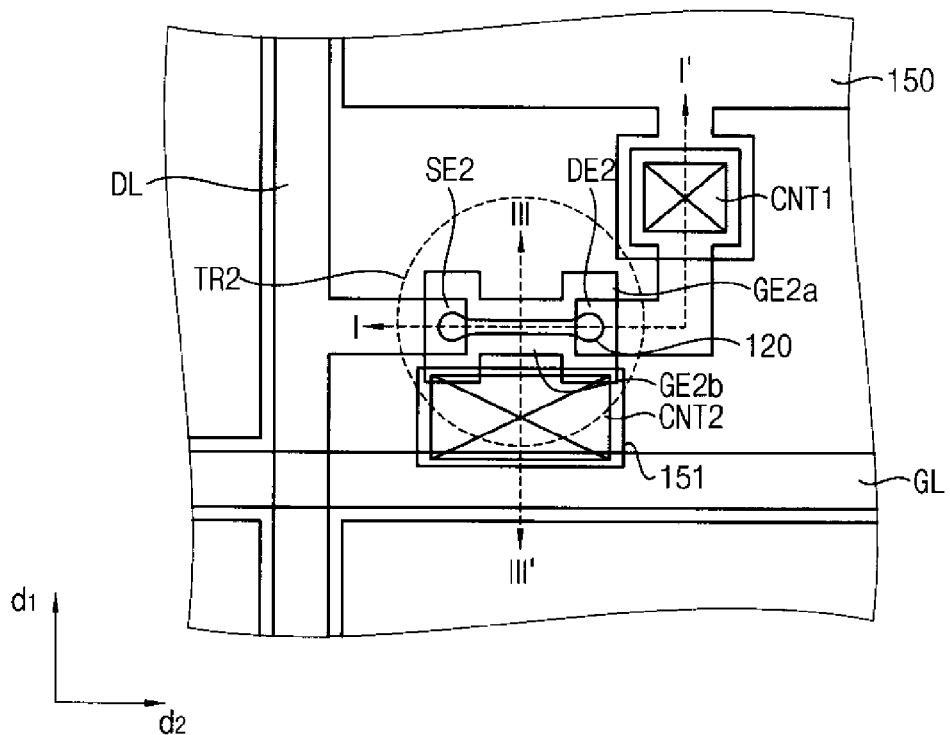
FIG. 8 is a plan view of another exemplary embodiment of a display substrate according to the invention.
Figure 9:
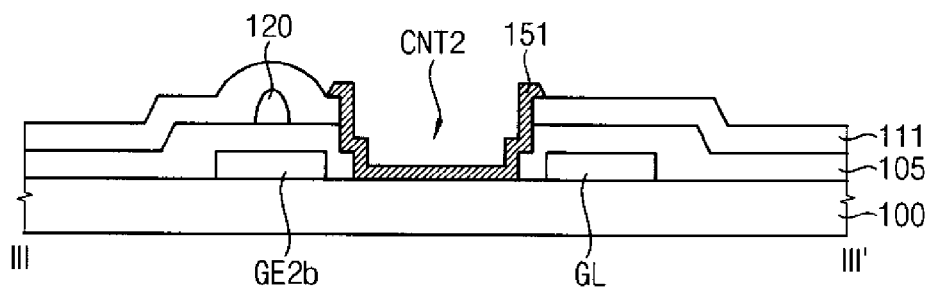
FIG. 9 is a cross-sectional view taken along line III-III' of FIG. 8.

FIG. 8 is a plan view of another exemplary embodiment of a display substrate according to the invention. FIG. 9 is a cross-sectional view taken along line III-III' of FIG. 8.

A display substrate in FIGS. 8 and 9 is substantially the same as the display substrate illustrated in FIGS. 3 to 7F except for a gate electrode GE2, an active pattern 120 and a second contact hole CNT2. Thus, detailed description of the identical elements is omitted.

Referring to FIGS. 4, 8, and 9, the display substrate includes a base substrate 100, a gate electrode GE2, a gate insulation layer 105, an active pattern 120, an ohmic contact layer 107, a source electrode SE2, a drain electrode DE2, a passivation layer 111, a first contact hole CNT1, a second contact hole CNT2, a pixel electrode 150 and a gate connection layer 151.

The gate electrode GE2 is spaced apart from a gate line GL in a first direction d1 on the base substrate 100. The gate electrode GE2 includes a first gate electrode part GE2*a* and a second gate electrode part GE2*b*.

The first gate electrode part GE2*a* has a first width in the first direction d1 while the second gate electrode part GE2*b* has a third width smaller than the first width in the first direction d1. As illustrated in FIG. 8, for example, the gate electrode GE2 may have a substantially 'H' planar shape, but is not limited thereto or thereby. In one exemplary embodiment, a portion of a rectangular shape having a longer side in a second direction d2 perpendicular to the first direction d1, may be partially removed corresponding to the second gate electrode part GE2*b*.

The gate electrode GE2 may include aluminum (Al), copper (Cu), molybdenum (Mo), titanium (Ti), alloys thereof or a combination thereof. Alternatively, the gate electrode GE2 may include a transparent conductive material such as indium tin oxide ("ITO"), indium zinc oxide ("IZO"), aluminum doped zinc oxide ("AZO") or a combination thereof.

The gate electrode GE2 may have a single layer structure. Alternatively, the gate electrode GE2 may have a multiple layer structure in which a plurality of conductive layers is stacked, or conductive layers and insulation layers are stacked.

The active pattern 120 is formed on the gate insulation layer 105 corresponding to an area including the gate electrode GE2. Specifically, the active pattern 120 overlaps with a center of an area corresponding to the gate electrode GE2. The active pattern 120 functions as a channel layer of the thin film transistor TR2.

The active pattern 120 may include polysilicon. Specifically, in an exemplary embodiment, the active pattern 120 including polysilicon may be formed by illuminating a laser on an amorphous silicon a-Si which is on the gate insulation layer 105, and then crystallizing the amorphous silicon a-Si. Accordingly, the active pattern 120 having a longitudinal axis which is extended in the second direction d2 and having a dumbbell shape is formed corresponding to the 'H' shaped gate electrode GE2. The dumbbell shape may be defined by opposing ends being wider than a portion connecting the opposing ends. That is, based on the planar shape and/or dimensions of the underlying gate pattern, a width of a channel area of the active pattern may be different from the width of portions overlapping the source electrode and the drain electrode. Accordingly, the width of the channel layer of the transistor may be controlled.

The second contact hole CNT2 is formed in the passivation layer 111. The second contact hole CNT2 is formed in an area between the gate electrode GE2 and the gate line GL. The second contact hole CNT2 partially exposes the base substrate 100, the first gate electrode part GE2a at an end of the gate electrode GE2, and the gate line GL.

The gate connection layer 151 electrically connects the gate electrode GE2 and the gate line GL through the second contact hole CNT2. Specifically, the gate connection layer 151 electrically connects the first gate electrode GE2a at the end of the gate electrode GE2, and the gate line GL, to each other. The gate connection layer 151 may include a transparent conductive material such as indium tin oxide ("ITO"), indium zinc oxide ("IZO"), aluminum doped zinc oxide ("AZO") or a combination thereof.

Although the second contact hole CNT2 partially exposes the first gate electrode part GE2a, and the gate connection layer 151 electrically connects the gate line GL and the first gate electrode part GE2a in the exemplary embodiment of the invention, in an alternative exemplary embodiment, the second contact hole CNT2 may partially expose both the first gate electrode part GE2a and the second gate electrode part GE2b, and the gate connection layer 151 may electrically connect the gate line GL with both the first gate electrode part GE2a and the second gate electrode part GE2b.

According to the exemplary embodiment, a gate electrode of a thin film transistor may have a substantially 'H' planar shape to form the width of a channel area of an active pattern different from the width of portions overlapping the source electrode and the drain electrode. Accordingly, a width of a channel in a thin film transistor may be controlled. Also, the manufacturing processes can be simplified, and the active pattern can be formed in a desired area at a low cost with high quality.

Figure 10:
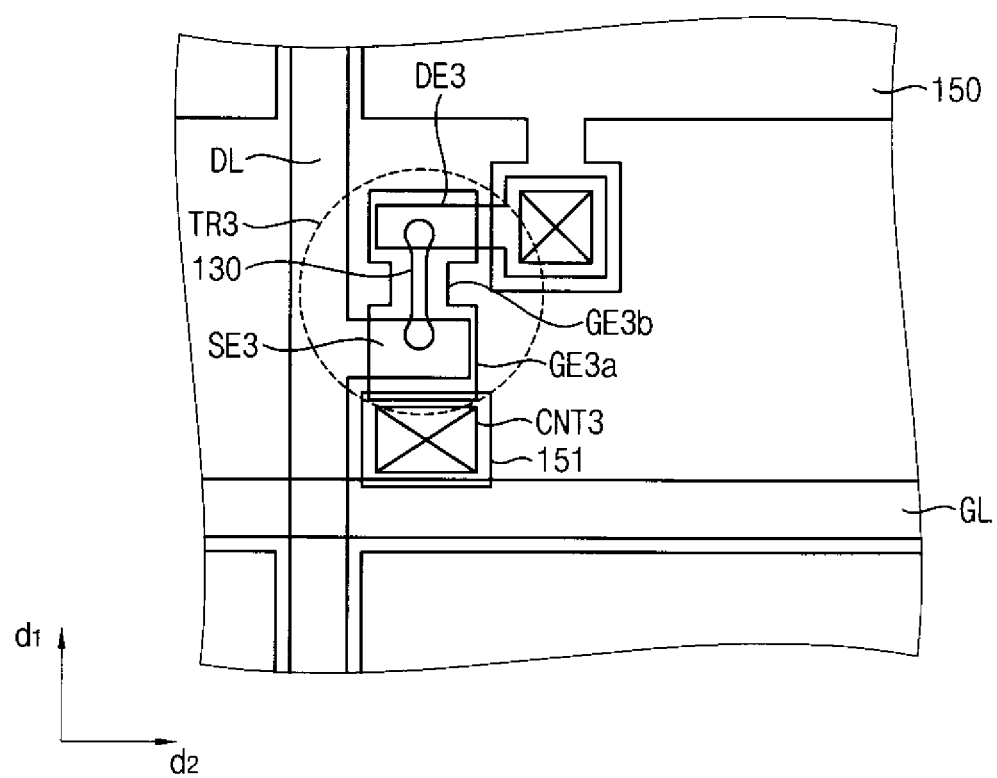
FIG. 10 is a cross-sectional view of still another exemplary embodiment of a display substrate according to the invention.

FIG. 10 is a cross-sectional view of still another exemplary embodiment of a display substrate according to the invention.

A display substrate in FIG. 10 is substantially the same as the display substrate illustrated in FIGS. 8 and 9 except for a gate electrode GE3, an active pattern 130, a second contact hole CNT2 and a gate connection layer 151. Thus, detailed description of the identical elements is omitted.

Referring to FIGS. 4 and 10, the display substrate includes a gate electrode GE3, a gate insulation layer 105, an active pattern 130, an ohmic contact layer 107, a source electrode SE3, a drain electrode DE3, a passivation layer 111, a first contact hole CNT1, a second contact hole CNT2, a pixel electrode 150 and a gate connection layer 151.

The gate electrode GE3 is spaced apart from a gate line GL in a first direction d1 on the base substrate 100. The gate electrode GE3 includes a first gate electrode part GE3a and a second gate electrode part GE3b.

The first gate electrode part GE3a has a first width in a second direction d2 perpendicular to the first direction d1 while the second gate electrode part GE3b has a third width smaller than the first width in the second direction d2. As illustrated in FIG. 10, for example, the gate electrode GE3 may have a substantially 'I' planar shape, but is not limited thereto or thereby. In one exemplary embodiment, a portion of a rectangular shape having a longer side in a first direction d1 perpendicular to the second direction d2, may be partially removed corresponding to the second gate electrode part GE3b.

The gate electrode GE3 may include aluminum (Al), copper (Cu), molybdenum (Mo), titanium (Ti), alloys thereof or a combination thereof. Alternatively, the gate electrode GE3 may include a transparent conductive material such as indium tin oxide ("ITO"), indium zinc oxide ("IZO"), aluminum doped zinc oxide ("AZO") or a combination thereof.

The gate electrode GE3 may have a single layer structure. Alternatively, the gate electrode GE3 may have a multiple layer structure in which a plurality of conductive layers is stacked, or conductive layers and insulation layers are stacked.

The active pattern 130 is formed on the gate insulation layer 105 corresponding to an area including the gate electrode GE3. Specifically, the active pattern 130 overlaps with a center of an area corresponding to the gate electrode GE3. The active pattern 130 functions as a channel layer of the thin film transistor TR3.

The active pattern 130 may include polysilicon. Specifically, in an exemplary embodiment, the active pattern 130 including polysilicon may be formed by illuminating a laser on an amorphous silicon a-Si which is on the gate insulation layer 105, and then crystallizing the amorphous silicon a-Si. Accordingly, the active pattern 130 having a longitudinal axis which is extended in the first direction d1 and having a dumbbell shape is formed corresponding to the 'I' shaped gate electrode GE3.

The second contact hole CNT2 is formed in the passivation layer 111. The second contact hole CNT2 is formed in an area between the gate electrode GE3 and the gate line GL. The second contact hole CNT2 partially exposes the base substrate 100, the first gate electrode part GE3a at an end of the gate electrode GE3, and the gate line GL.

The gate connection layer 151 electrically connects the gate electrode GE3 and the gate line GL through the second contact hole CNT2. Specifically, the gate connection layer 151 electrically connects the first gate electrode GE3a at the end of the gate electrode GE3, and the gate line GL, to each other. The gate connection layer 151 may include a transparent conductive material such as indium tin oxide ("ITO"), indium zinc oxide ("IZO"), aluminum doped zinc oxide ("AZO") or a combination thereof.

According to the exemplary embodiment, a gate electrode of a thin film transistor may have a substantially 'I' planar shape to form the width of a channel area of an active pattern different from the width of overlapped areas with the source electrode and the drain electrode. Accordingly, a width of a channel in a thin film transistor may be controlled. Also, the manufacturing processes can be simplified, and the active pattern can be formed in a desired area at a low cost with high quality.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of forming an active pattern, the method comprising:
    forming a gate metal layer on a base substrate;
    patterning the gate metal layer to form a gate line, and a gate pattern of which each side thereof is spaced apart from the gate line in a plan view;
    forming a gate insulation layer on the base substrate comprising the gate line and the gate pattern thereon, to form a first protruded boundary surface corresponding to an area comprising the gate pattern;
    forming an amorphous semiconductor layer on the base substrate comprising the gate insulation layer thereon, to form a second protruded boundary surface corresponding to the first protruded boundary surface; and
    forming the active pattern, each side of which is within the sides of the gate pattern in the plan view by illuminating a laser to the amorphous semiconductor layer on the second protruded boundary surface, to crystallize the amorphous semiconductor layer.

2. The method of claim 1, wherein the amorphous semiconductor layer comprises amorphous silicon.

3. The method of claim 2, wherein an intensity of the laser is substantially equal to or greater than about 500 millijoules per square centimeter and is substantially equal to or lower than about 550 millijoules per square centimeter.

4. The method of claim 1, wherein the gate pattern has a substantially rectangular planar shape having a longer side and a shorter side.

5. The method of claim 1, wherein
    the gate pattern has an elongated shape extending in an extension direction, comprising
        opposite ends of the gate pattern in the extension direction, and having a first width in a width direction substantially perpendicular to the extension direction, and
        an area between the opposite ends and having a second width smaller than the first width in the width direction.

6. A display substrate comprising:
    a base substrate;
    a gate line extending in a first direction, on the base substrate;
    a gate electrode spaced apart from the gate line;
    a gate insulation layer on the gate line and the gate electrode;
    an active pattern on the gate insulation layer and overlapping the gate electrode, the active pattern comprising polysilicon; and
    a gate connection layer which electrically connects the gate line and the gate electrode through a first contact hole, wherein the first contact hole partially exposes the gate line, the gate electrode, and the base substrate corresponding to an area between the gate line and the gate electrode.

7. The display substrate of claim 6, wherein
    the gate electrode has a substantially rectangular planar shape having a longer side and a shorter side, and
    a longitudinal axis of a channel of the active pattern is substantially parallel with the longer side.

8. The display substrate of claim 6, wherein
    the gate electrode has an elongated shape extending in an extension direction, comprising:
        a first gate electrode part at opposite ends of the gate electrode in the extension direction, and having a first width in a width direction substantially perpendicular to the extension direction, and
        a second gate electrode part between the opposite ends of the gate electrode and having a second width smaller than the first width in the width direction.

9. The display substrate of claim 8, further comprising:
    a data line, and a source electrode electrically connected to the data line; and
    a pixel electrode, and a drain electrode electrically connected to the pixel electrode;
    wherein opposite ends of the active pattern overlap the first gate electrode part, and a longitudinal axis of a channel of the active pattern between the opposite ends thereof, is substantially parallel with the first direction, and
    wherein the source electrode and the drain electrode overlap the opposite ends of the active pattern.

10. The display substrate of claim 9,
    wherein the first contact hole partially exposes the first gate electrode part of the gate electrode, and
    wherein the gate connection layer electrically connects the first gate electrode part to the gate line.

11. The display substrate of claim 8, further comprising:
    a data line, and a source electrode electrically connected to the data line; and
    a pixel electrode, and a drain electrode electrically connected to the pixel electrode;
    wherein opposite ends of the active pattern overlap the first gate electrode part, and a longitudinal axis of a channel of the active pattern between the opposite ends thereof, is substantially parallel with a second direction substantially perpendicular to the first direction, and
    wherein the source electrode and the drain electrode overlap the opposite ends of the active pattern.

12. A method of manufacturing a display substrate comprising:
    forming a gate metal layer on a base substrate;
    patterning the gate metal layer using a first mask, to form a gate line extending in a first direction, and a gate electrode spaced apart from the gate line;
    forming a gate insulation layer on the base substrate comprising the gate line and the gate electrode thereon, to form a first protruded boundary surface corresponding to an area comprising the gate electrode;
    forming an amorphous silicon layer on the base substrate comprising the gate insulation layer thereon, to form a second protruded boundary surface corresponding to the first protruded boundary surface;
    crystallizing the amorphous silicon layer by illuminating a laser on the second protruded boundary surface, to form an active pattern;
    forming a first contact hole which partially exposes the gate line, the gate electrode, and the base substrate corresponding to an area between the gate line and the gate electrode; and
    forming a gate connection layer which electrically connects the gate line to the gate electrode through the first contact hole.

13. The method of claim 12, wherein an intensity of the laser is substantially equal to or greater than about 500 millijoules per square centimeter and is substantially equal to or lower than about 550 millijoules per square centimeter.

14. The method of claim 12, wherein the gate electrode has a substantially rectangular planar shape having a longer side and a shorter side.

15. The method of claim 12, wherein
    the gate electrode has an elongated shape extending in an extension direction, comprising:
        a first gate electrode part at opposite ends of the gate electrode in the extension direction, and having a first width in a width direction substantially perpendicular to the extension direction, and a second gate electrode part between the opposite ends of the gate electrode and having a second width smaller than the first width in the width direction.

16. The method of claim 12, wherein the method further comprises:

forming a source electrode electrically connected to a data line, and a drain electrode spaced apart from the source electrode, the source electrode overlapping a first end of the active pattern and the drain electrode overlapping a second end of the active pattern opposing the first end; and forming a passivation layer on the base substrate comprising the data line, the source electrode and the drain electrode thereon, the passivation layer comprising silicon oxide.

17. The method of claim 16, wherein the forming the source electrode and the drain electrode comprises:

forming a photoresist pattern using a second mask, the photoresist pattern having a first thickness part, and a second thickness part thinner than the first thickness part;

forming the data line, and an electrode pattern connected to the data line, using the photoresist pattern as an etch stopping layer;

ashing the photoresist pattern to form a remaining photoresist pattern in which the second thickness part is removed; and patterning the electrode pattern using the remaining photoresist pattern to expose the active pattern between the source electrode and the drain electrode.

18. The method of claim 12, wherein the method further comprises:

forming a second contact hole which exposes a drain electrode, the drain electrode overlapping a first end of the active pattern; and forming a pixel electrode electrically connected to the drain electrode through the second contact hole.

19. The method of claim 18, wherein the first contact hole and the second contact hole are formed in a same process using a third mask.

20. The method of claim 18, wherein the forming the gate connection layer and the forming the pixel electrode comprise:

forming a transparent conductive layer on the base substrate comprising the first contact hole and the second contact hole; and patterning the transparent conductive layer using a fourth mask, to form the gate connection layer and the pixel electrode, simultaneously.

* * * * *